United States Patent [19]

Moyer et al.

[11] Patent Number: 4,959,702
[45] Date of Patent: Sep. 25, 1990

[54] SI-GAP-SI HETEROJUNCTION BIPOLAR TRANSISTOR (HBT) ON SI SUBSTRATE

[75] Inventors: Curtis D. Moyer; Raymond K. Tsui, both of Phoenix, Ariz.

[73] Assignee: Motorola, Inc., Schaumburg, Ill.

[21] Appl. No.: 417,417

[22] Filed: Oct. 5, 1989

[51] Int. Cl.$^5$ .................. H01L 29/72; H01L 29/161; H01L 29/80
[52] U.S. Cl. ........................ 357/34; 357/61; 357/22
[58] Field of Search .......................... 357/34, 61, 22 A

[56] References Cited

U.S. PATENT DOCUMENTS 4,617,724 10/1986 Yokoyama et al. .................... 357/34

OTHER PUBLICATIONS

T. Katoda et al; "Heteroepitaxial Growth of Gallium Phosphide on Silicon", Journal of Electronic Materials, vol. 9, No. 4, 1980.

H. Kroemer, "Heterojunctions," JAP, J.A.P., vol. 20 (1981), Suppl. 20-1, pp. 9-13.

Primary Examiner—Rolf Hille
Assistant Examiner—Wael Fahmy
Attorney, Agent, or Firm—Joe E. Barbee; Stuart T. Langley

[57] ABSTRACT

A heterojunction bipolar transistor (HBT) is provided having a silicon substrate in which a conventional junction base is formed. A coherently strained layer of semiconductor material having a wider band gap than silicon, such as gallium phosphide, is formed over the base to form a first portion of an emitter multilayer. A second portion of the emitter multilayer comprises silicon which can be epitaxially grown on the coherently strained layer. A thin heteropotential barrier is thus formed at the base-emitter junction which preferentially allows electrons to move from emitter to base while significantly reducing hole current from base to emitter, thereby improving emitter injection efficiency and current gain.

11 Claims, 2 Drawing Sheets

SI-GAP-SI HETEROJUNCTION BIPOLAR TRANSISTOR (HBT) ON SI SUBSTRATE

BACKGROUND OF THE INVENTION

This invention relates, in general, to heterojunction bipolar transistors and, more particularly, to heterojunction bipolar transistors formed on silicon substrates.

Silicon junction bipolar transistors are commonly used as discrete devices and as elements of integrated circuits. Conventional junction bipolar transistors comprise a silicon substrate having a base region diffused in the substrate and an emitter region diffused into the base region. Silicon is a mechanically sturdy substrate on which to form devices, and is compatible with batch processing equipment. Additionally, large diameter silicon substrates are available which allow many devices to be fabricated on a single substrate.

Emitter injection efficiency and current gain of the conventional bipolar junction transistor are limited by resistivity of the base and emitter regions. Lower base resistivity degrades emitter injection efficiency and current gain. High emitter resistivity also degrades emitter injection efficiency and current gain. To improve operating speed, however, it is desirable to have low base resistivity and high emitter resistivity. A significant portion of the delay time associated with a conventional junction bipolar transistor is related to the product of base resistance ($R_b$) and emitter capacitance ($C_e$). $R_b$ is directly proportional to base resistivity while $C_e$ is inversely proportional to emitter resistivity. A low time constant $R_bC_e$ requires low base resistivity and high emitter resistivity, resulting in poor emitter injection efficiency.

Heterojunction bipolar transistors (HBTs) are well-known in the semiconductor art. HBTs offer advantages over conventional junction bipolar transistors by providing a heteropotential between base and emitter regions. In an NPN transistor, this heteropotential restricts hole flow from base to emitter, thus improving emitter injection efficiency and current gain. The improved emitter injection efficiency allows the use of low resistivity base regions and high resistivity emitter regions to create fast devices without compromising other device parameters. Thus, HBTs can have high current gain while at the same time having a low base resistivity and low emitter base junction capacitance.

HBTs are usually formed from III-V compound semiconductor materials. Compound semiconductor materials in general are quite expensive and are difficult to work with in a manufacturing environment. In particular, III-V compound materials are quite fragile, so that conventional semiconductor handling equipment is difficult to use. In addition, III-V compound semiconductor wafers are significantly smaller than silicon semiconductor wafers due to the added fragility. All of these factors combine to make processing of III-V materials significantly more expensive than silicon processing.

Attempts have been made to form heterojunction bipolar transistors using silicon substrates. To form an HBT, the emitter must have a wider bandgap than the base. The bandgap differential results in a valence band discontinuity at the base-emitter junction. To achieve this bandgap relationship on a silicon substrate requires that a different material, having a different bandgap than silicon, be deposited epitaxially on the silicon substrate. One such silicon HBT uses a germanium-silicon base upon which a silicon emitter is formed. This structure results in a valence band discontinuity of about 0.2 eV. While this valence band discontinuity serves to block some hole flow from base to emitter, it is desirable to have a larger valence band discontinuity.

Recently, techniques have been developed to epitaxially grow gallium phosphide (GaP) on silicon. GaP-Si junctions are heterojunctions with the GaP having a wider bandgap than the Si. A mismatch in lattice constants between GaP and Si made it difficult to grow high quality GaP films which could be used as emitters. In particular, GaP layers exhibited lattice mismatch defects and cracks when GaP layers of even a few thousand angstroms were made larger than a few square mils. Due to the difficulty in growing GaP on silicon and the poor quality of the semiconductor junction thus formed, GaP-Si HBTs have not been commercially feasible.

Accordingly, it is an object of the present invention to provide a heterojunction bipolar transistor having a silicon substrate.

It is another object of the present invention to provide a heterojunction bipolar transistor having a low resistance emitter.

It is a further object of the present invention to provide a heterojunction bipolar transistor (HBT) having improved operating speed.

It is another object of the present invention to provide a heterojunction bipolar transistor having a coherently strained emitter layer.

SUMMARY OF THE INVENTION

These and other objects and advantages of the present invention are achieved by a heterojunction bipolar transistor having a silicon substrate in which a conventional junction base is formed. A coherently strained layer of semiconductor material having a wider band gap than silicon, such as gallium phosphide, is formed over the base to form a first portion of an emitter multilayer. A second portion of the emitter multilayer comprises silicon which is epitaxially grown on the coherently strained layer. A thin heteropotential barrier is thus formed at the base-emitter junction which preferentially allows electrons to move from emitter to base while significantly reducing hole current from base to emitter, thereby improving emitter injection efficiency and current gain.

DETAILED DESCRIPTION OF DRAWINGS

Figure 1:
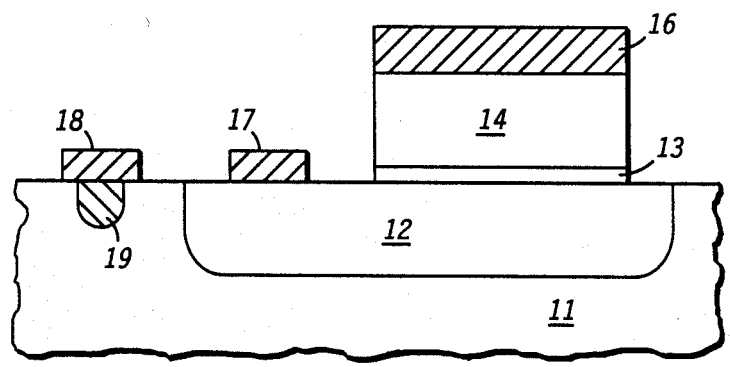
FIG. 1 illustrates a cross-sectional view of a heterojunction bipolar transistor (HBT) embodying the present invention.

FIG. 1 illustrates in cross-section a heterojunction bipolar transistor (HBT) embodying the present invention. Collector layer 11 comprises silicon and for an NPN transistor is doped N-type with a dopant such as phosphorous. Collector layer 11 is preferable epitaxially grown on a silicon substrate (not shown), or in some cases, collector layer 11 may be a silicon substrate. Base region 12, having an opposite conductivity to that of collector layer 11, is formed in collector layer 11 by diffusion, ion implantation or other well-known techniques. Alternatively, base region 12 may be formed on collector layer 11 by epitaxial processes. Contact enhancement diffusion 19, or any other diffusion into the silicon which requires thermal processing over approximately 800° C. must be formed at this point in processing. As will be apparent, a coherently strained layer 13 which is formed on top of a portion of base region 12, limits further thermal processing.

A coherently strained layer 13 is formed on top of a portion of base region 12. Coherently strained layer 13 must have a wider bandgap than silicon. A suitable material for coherently strained layer 13 is gallium phosphide (GaP). A coherently strained layer is a layer which is so thin that any mismatch in lattice constant between gallium phosphide layer 13 and silicon base region 12 does not result in lattice mismatch defects. Thus, the coherently strained layer is essentially single crystalline with a nominal number of defects. Because gallium phosphide dissociates at approximately 800° C., and gallium and phosphorous are both dopants in silicon, it is important that processing subsequent to the formation of GaP layer 13 is below approximately 800° C. It should be understood that other processing parameters such as time and pressure will effect GaP layer 13, and must be considered when forming layers subsequent to GaP layer 13. If other materials are chosen for coherently strained layer 13, similar processing considerations must be taken into account.

Silicon emitter layer 14 is epitaxially grown on top of GaP layer 13 and is either selectively grown to cover GaP layer 13 or patterned so as not to extend outside the lateral boundary of GaP layer 13. Silicon emitter layer 14 is doped during epitaxial growth with a sufficiently high carrier concentration so that an ohmic contact can be made between an electrode 16 and silicon emitter layer 14. Since emitter capacitance $C_e$ is proportional to emitter doping density, it is desirable to form silicon emitter layer 14 with a graded doping profile. This reduces $C_e$ while providing a high doping concentration for contact to electrode 16. Alternatively, silicon emitter layer 14 may have an abrupt doping profile. Emitter electrode 16, base electrode 17, and collector electrode 18 are formed by conventional metal deposition and patterning techniques.

Figure 2:
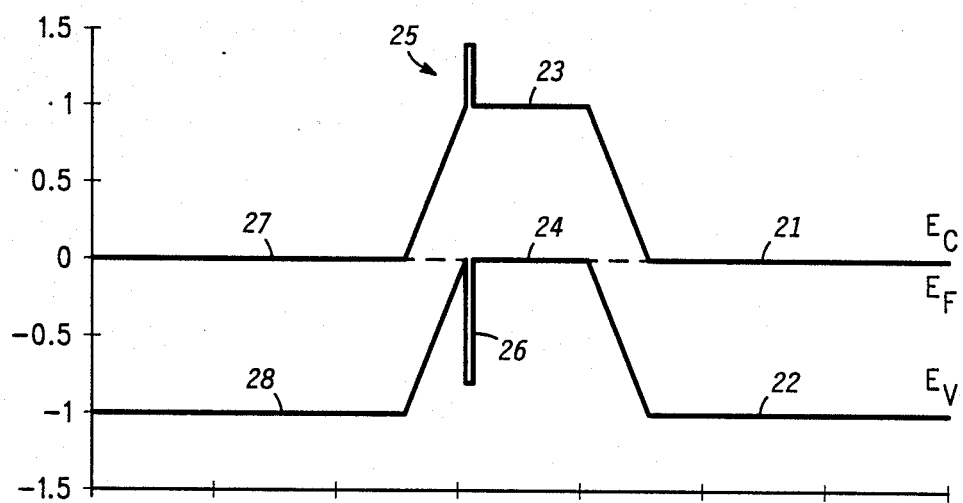
FIGS. 2-3 illustrate a band diagram of the HBT of the present invention.

FIG. 2 illustrates a zero biased bandgap diagram for the HBT as shown in FIG. 1. Conduction band energy $E_c$ and valence band energy $E_v$ are shown on a vertical scale in relationship to Fermi level $E_f$. Silicon collector layer 11 shown in FIG. 1, is illustrated by lines 21 and 22 in FIG. 2. Bandgap energy of silicon collector layer 11 is equal to $E_c$-$E_v$, or approximately 1.12 eV for silicon. Base region 12 is illustrated by lines 23 and 24 and has the same bandgap energy as collector layer 11. GaP layer 13 is illustrated by spikes 25 and 26 and has a bandgap of approximately 2.26 eV. A discontinuity in Ec and Ev is caused by GaP layer 13. Silicon emitter layer 14 is illustrated by lines 27 and 28, and again has a silicon bandgap of 1.12 eV.

Figure 3:
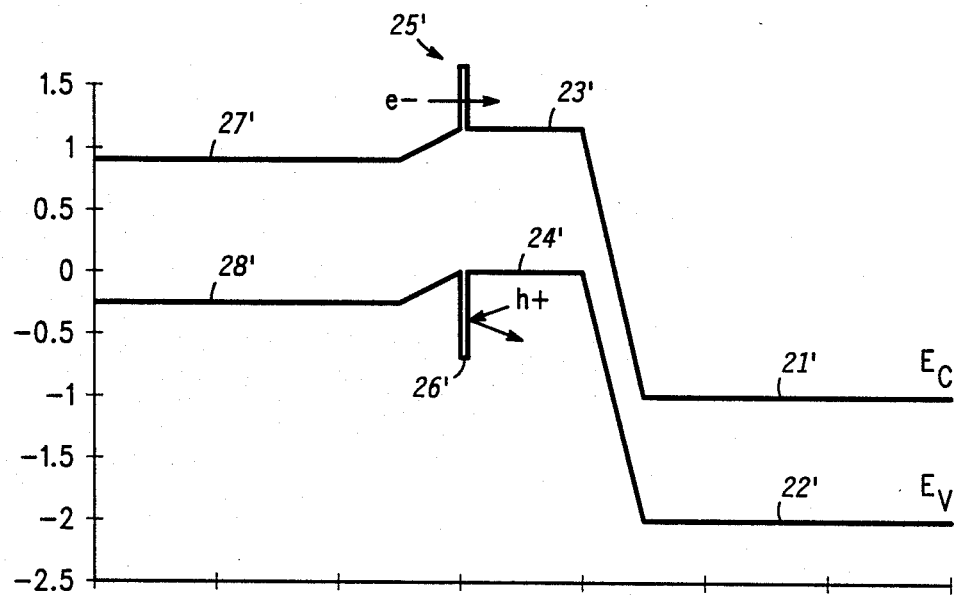

The collector and base regions are conventional silicon junction transistor bandgap diagrams. Bandgap diagrams shown in FIGS. 2-3 illustrate an NPN transistor but it should be understood that obvious modifications could be made to incorporate the present invention in a PNP transistor. Silicon collector layer 11, which is a collector of the HBT, is doped N-type and has a conduction band 21 which is very close to the Fermi level $E_f$. P-type base region 12 has a valence band 24 which is very close to $E_f$. Gallium phosphide layer 13 forms a discontinuity in both the valence and conduction bands. Silicon has a bandgap energy of 1.12 eV while GaP has a bandgap of approximately 2.26 eV. This results in a total bandgap discontinuity of 2.26-1.12 or approximately 1.1 eV. The 1.1 eV bandgap difference is split between the valence and conduction bands, and based on electron affinity data approximately ⅓ of the discontinuity will appear in the conduction band and ⅔ of the discontinuity will appear in the valence band. Thus, the conduction band shows a rise of approximately 0.4 eV from the silicon base region 12 to GaP layer 13. The valence band diagram shows a drop of approximately 0.7 eV in the transition between the silicon base region 12 and GaP layer 13. The silicon emitter 14 which is formed on top of GaP layer 13 has a bandgap of 1.12 eV and is doped N-type so that the conduction band is very close to $E_f$. FIG. 3 illustrates a biased bandgap diagram for the HBT shown in FIG. 2. Elements of FIG. 3 which correspond to FIG. 2 are indicated by similar numbers bearing a prime designation. Since the concept of a Fermi level does not apply directly to a biased bandgap diagram, $E_C$ and $E_V$ are shown in relationship to base valence band 24'. Forward biasing the base-emitter junction results in a band realignment which allows electrons to flow from emitter 14 to the collector 11. Electrons tunnel through the discontinuity in the conduction band caused by GaP layer 13, indicated by an arrow through region 25'. Emitter to base electron flow is more probable than base to emitter hole flow for two reasons. First, the thickness of GaP layer 13 (0.01 to 0.03 microns) is such that tunnelling of electrons through thin GaP layer 13 is much more probable than tunnelling of holes. Second, the discontinuity in the conduction band, which impedes electron flow, is small compared to the discontinuity in the valence band, which impedes hole flow.

It is believed that emitter injection efficiency is greatly improved by the presence of GaP layer 13. The improved emitter injection efficiency allows base region 12 to be doped more heavily, lowering base resistance $R_b$. Additionally, GaP layer 13 allows the use of a lightly doped emitter 14 which decreases emitter capacitance. Thus, switching speed is improved without sacrificing gain and emitter injection efficiency.

Because transit time of electrons in GaP is significantly longer than for a similar thickness of silicon, it is important that GaP layer 13 be thin, in the order of 100 to 300 angstroms. This thickness range of GaP is believed to create a functional heteropotential which does not significantly increase switching time of the transistor. Additionally, this relatively thin GaP layer allows strain which is cause by lattice mismatch between the GaP and Si to be contained by lattice stretching rather than crystal defects.

It should be appreciated that a heterojunction bipolar transistor has been provided which can be formed on a silicon substrate. By using an emitter multi-layer comprising a first layer of gallium phosphide which is in contact with a base, and a second layer of silicon, emitter injection efficiency is improved. Thus, advantages of a heterojunction bipolar transistor are achieved in an essentially silicon structure so that silicon processing equipment and technology can be used.

We claim:

1. A heterojunction bipolar transistor (HBT) comprising: a silicon collector layer of a first conductivity type; a base region of a second conductivity type formed adjacent to the collector layer; an epitaxially grown gallium phosphide (GaP) region formed on top of of the base region; and an epitaxially grown silicon emitter of the first conductivity type formed over the GaP region.

2. The HBT of claim 1 wherein the GaP region is from 0.01 microns to 0.03 microns thick.

3. The HBT of claim 1 wherein the GaP region is essentially free of lattice mismatch defects.

4. A heterojunction bipolar transistor (HBT) comprising: a silicon layer of a first conductivity type which serves as a collector; a base region of a second conductivity type formed on the silicon layer of a first conductivity type; an epitaxially grown coherently strained region formed on top of the base region, wherein the coherently strained region has a wider bandgap than that of silicon; and an epitaxially grown silicon emitter of the first conductivity type formed over the coherently strained region.

5. The HBT of claim 4 wherein the coherently strained region comprises a material with a lattice constant which closely matches silicon.

6. The HBT of claim 4 wherein the thickness of the coherently strained region is such that hole tunneling through the coherently strained region is significantly less probable than electron tunneling.

7. The HBT of claim 4 wherein the silicon emitter has a graded doping concentration.

8. The HBT of claim 4 wherein the silicon emitter has an abrupt doping concentration.

9. A heterojunction bipolar transistor (HBT) comprising: a silicon substrate of a first conductivity type which serves as a collector; a base region of a second conductivity type formed in the substrate; an emitter multilayer formed in contact with the base region, wherein the emitter multilayer forms a valence band discontinuity with the base region.

10. The HBT of claim 9 wherein the valence band discontinuity is greater than 0.25 eV.

11. The HBT of claim 9 wherein the emitter multilayer comprises a GaP layer which is formed in contact with the base region and a silicon emitter layer of the first conductivity type which is formed in contact with the GaP layer.

* * * * *